United States Patent [19]
Beilin et al.

[11] Patent Number: 5,544,017
[45] Date of Patent: Aug. 6, 1996

[54] MULTICHIP MODULE SUBSTRATE

[75] Inventors: Solomon I. Beilin, San Carlos; William T. Chou, Cupertino; David Kudzuma, San Jose; Michael G. Lee, San Jose; Teruo Murase, San Jose; Michael G. Peters, Santa Clara; James J. Roman, Los Altos; Som S. Swamy, Danville; Wen-chou V. Wang, Cupertino, all of Calif.

[73] Assignee: Fujitsu Limited, Japan

[21] Appl. No.: 277,163

[22] Filed: Jul. 19, 1994

Related U.S. Application Data

[63] Continuation-in-part of Ser. No. 157,332, Nov. 22, 1993, Pat. No. 5,426,563, which is a continuation of Ser. No. 925,962, Aug. 5, 1992, abandoned.

[51] Int. Cl.⁶ .................................................. H05K 1/14
[52] U.S. Cl. ......................... 361/790; 174/255; 361/749
[58] Field of Search ............................... 257/712–714; 165/80.3, 80.4; 174/255, 260–262, 254, 267; 439/65–69, 74, 77; 361/689, 699, 721, 735, 6, 749, 773, 775, 778, 783–785, 789–795

[56] References Cited

U.S. PATENT DOCUMENTS

| | | | |
|---|---|---|---|
| 3,777,220 | 12/1973 | Tatusko et al. | 317/101 A |
| 4,237,606 | 12/1980 | Niwa et al. | 29/830 |
| 4,480,288 | 10/1984 | Gazdik | 361/398 |
| 4,509,099 | 4/1985 | Takamutsu | 361/789 |
| 4,648,179 | 3/1987 | Bhattacharyya et al. | 29/832 |
| 4,937,659 | 6/1990 | Chall, Jr. | 357/74 |
| 5,006,673 | 4/1991 | Freyman et al. | 174/255 |
| 5,055,907 | 10/1991 | Jacobs | 357/71 |
| 5,136,471 | 8/1992 | Inasaka | 361/414 |
| 5,155,661 | 10/1992 | Nagesh | 361/785 |
| 5,309,324 | 5/1994 | Herandez | 361/734 |
| 5,334,804 | 8/1994 | Love | 174/267 |
| 5,355,282 | 10/1994 | Yokemura | 361/785 |
| 5,396,034 | 3/1995 | Fujita | 174/261 |
| 5,426,563 | 6/1995 | Moresco | 361/689 |

OTHER PUBLICATIONS

"Power Grid Image For Embedded Arrays," IBM Technical Disclosure Bulletin, vol. 32, No. 8B, Jan. 1990.

*Primary Examiner*—Gerald P. Tolin
*Attorney, Agent, or Firm*—Coudert Brothers

[57] ABSTRACT

A multichip module substrate for use in a three-dimensional multichip module, and methods of making the same, are disclosed. The substrate comprises a thin film structure, for routing signals to and from integrated circuit chips, formed over a rigid support base. Apertures are formed in the support base exposing the underside of the thin film structure, thereby allowing high density connectors to be mounted on both surfaces of the thin film structure, greatly enhancing the ability to communicate signals between adjacent substrates in the chip module. This avoids the need to route the signals either through the rigid support base or to the edges of the thin film structure. Power and ground, which do not require a high connection density, are routed in low impedance paths through the support base. Preferably, the thin film structure is made of alternating layers of patterned metal, such as copper, and a low dielectric organic polymer, such as a polyimide.

14 Claims, 2 Drawing Sheets

MULTICHIP MODULE SUBSTRATE

RELATED APPLICATIONS

This case is a continuation-in-part of Ser. No. 08/157,332, now U.S. Pat. No. 5,426,563, entitled "THREE-DIMENSIONAL MULTICHIP MODULE," filed Nov. 22, 1993, which was a continuation of Ser. No. 07/925,962 filed Aug. 5, 1992, abandoned.

FIELD OF THE INVENTION

The invention is in the field of integrated circuit chip packaging technology, and is particularly related to structures for housing a plurality of integrated circuit chips in a three dimensional array.

BACKGROUND OF THE INVENTION

Integrated circuit (IC) "chips" comprising very large numbers of electronic components have become ubiquitous in modern society. Electronic devices and components of all sorts, from central processing units used in all levels of computing, to highly specialized controllers used to control various types of equipment and machinery, are now routinely available as integrated circuit chips. Since the introduction of the first IC chips, there has been a remarkable increase in the number of devices contained on a single chip, as well as a corresponding dramatic reduction in the size of the individual electronic components formed on the chip. Device geometries with line widths of the order of one micron have become common so that individual IC chips now routinely contain in excess of a million electronic components. Even higher device densities are projected.

The increase in device complexity and the decrease in device size has, for many types of IC chips, sharply increased the complexity of forming interconnections between the chips and external devices. These factors, along with a third, related phenomenon, i.e., the increased speed at which many digital devices now function, have increased the heat per unit volume produced by many chips to the point where active cooling methods are required to avoid thermal damage.

Many devices, such as computers, utilize a large number of separate IC chips. For example a computer may have one or more central processing unit (CPU) chips, various memory chips, controller chips, input/output (I/O) device chips, etc. Traditionally, each chip is mounted in a separate package which is then connected to a printed circuit board, for example, a computer "motherboard," which supplies power to the chip and provides signal routing among the chips on the board and to various I/O devices. However, where an electronic device utilizes a substantial number of chips, packaging each chip separately greatly increases the total area of printed circuit board needed to interconnect all the chips. In addition, as device speed has increased, the distance between individual components has become an increasingly important factor, so that it is important, in many applications, to minimize the signal path between IC chips used in the system.

In order to overcome the aforementioned problems, many device and system makers have begun using "multichip modules," i.e., packages housing a plurality of individual IC chips. Typical multichip modules incorporate not only means for interconnecting the IC chips with external devices, but also means for interconnecting the IC chips within the module. A general introduction to multichip modules, including a discussion of the history of the development thereof, is described in the text entitled: *Multichip Module Technologies and Alternatives, The Basics*, D. A. Doane, et al., eds., Van Nostrand Reinhold (1993). Multichip modules significantly reduce the overall space needed to house the IC chips and, by shortening the distance between chips within the module, facilitate high speed device operation.

The first multichip modules were two-dimensional, i.e., all of the IC chips housed in the package were mounted on a planar substrate. Subsequently, three-dimensional multichip modules were developed, thereby permitting an even further increase in the density of IC chips that could be housed in a single package. However, increasing the number of IC chips housed in a relatively small area further increases the overall heat per unit volume generated by the chip array, while concurrently complicating techniques for actively cooling the chips. Likewise, placing a large number of high density chips in close proximity greatly complicates the task of supplying power to and routing signals to and from the chips.

Many of the issues associated with three-dimensional multichip modules are described in a paper entitled: "System interconnect issues for sub-nanosecond signal transmission," (L. Moresco) published in *Int'l Symposium on Advances in Interconnection and Packaging, Book 2—Microelectronic Interconnects and Packages: System and Process Integration*, S. K. Tewksbury, et al., eds., Proceedings of the Int'l Soc. for Optical Eng., SPIE Vol. 1390, (1990). In view of the complicating factors associated with three-dimensional arrays, two-dimensional multichip arrays remain the most common form of multichip modules in use today.

Two major substrate technologies have developed for handling the power supply and signal routing in multichip modules. Initially, co-fired ceramic substrate technology was used but gradually there has been a shift to thin film substrate technology. In either case, IC chips are connected to one or more substrates which contains all the signal and power lines needed to supply power and to interconnect the chips to each other and to external devices. In order to make the required number of interconnections, such substrates are multilayered, sometimes containing dozens of individual layers. For example, even early ceramic substrate technology utilized as many as thirty-five separate layers in the multichip substrate. However, problems arise in placing signal lines in close proximity to each other and to power supply lines. The dielectric constant of the substrate material plays an important role in solving (or creating) these problems. As a result, ceramic technology has lost favor due to the high dielectric constant associated with the ceramic materials typically selected for use as a substrate material. Instead, low dielectric thin film substrates made of materials such as copper and polyimide have become more common.

Multichip module substrates comprising thin film structures, such as a multilayered copper polyimide structure, are not inherently rigid and, therefore, must be built upon a rigid support base. Various materials are used for the rigid support base including ceramics, silicon, and various metals. Important factors in selecting the support base are compatibility with the other materials and processes used in the multichip module, and ease of processing. Material compatibility includes such factors as having a coefficient of thermal expansion ("CTE") which is similar to the thin film structure and the IC chips mounted on the substrate, and being able to withstand the processing steps associated with the fabrication of the thin film structure. Such processing may expose the support base material to extreme temperatures and harsh chemicals.

In some instances, the support base used to support the thin film structure serves no other function than as a base for the thin film structure. In other instances, the support base may be used to route power and ground lines in a combination thin film/ceramic multichip module substrate.

In a typical three-dimensional multichip module, a plurality of coplanar IC chip substrates are stacked to increase the density of the chip package. In such modules, signal, power and ground lines must be routed not only in the plane of the substrates, but also from one substrate to the next. If the plane in which a substrate lies is defined to be the x-y plane, then it will be appreciated that, in order to communicate with IC chips mounted in different levels or layers, signals must also be routed in the z direction. In known three-dimensional multichip modules, routing of the z-axis signal paths occurs at the edges of the substrates. Edge routing in the z-axis has the disadvantage of lengthening the signal paths between chips mounted on different substrates.

A problem with traditional approaches to packaging IC chips in multichip arrays is the method used for delivering power to the chips. As noted above, one aspect of this problem results from routing power lines through the same substrate utilized to carry signals to and from the chip. Equally important is the fact that the thinness of the substrates used in traditional thin film multichip modules results in power feeds to the IC chips that have relatively high impedance. This high impedance results in undesired noise, power loss and excess thermal energy production.

An object of the present invention is to improve the routing of signal and power lines to the integrated circuit chips in a three-dimensional multichip module.

A particular object of the present invention is to provide a structure, and a method of making the same, for providing high density z-axis signal routing which does not require that signals travel to the edge of substrate in order to connect to an IC chip on another substrate.

Still another object of the present invention is to provide improved low impedance means for delivering power to the chips of a multichip module.

Yet another object of the present invention is to provide a three-dimensional multichip module design that is highly modular so that the individual components can be pretested prior to final assembly of the module, and such that at least some of said components are replaceable.

SUMMARY OF THE INVENTION

These and other objects that will become apparent to those skilled in the art after reading this specification along with the appended drawings and claims are realized in the present invention for a multichip module substrate. In its broad aspect the present invention comprises a substrate for mounting microelectronic components, such as integrated circuit chips, comprising a generally planar, rigid support base having apertures formed therein, a thin film structure formed over the support base such that the thin film structure spans the apertures and thereby has exposed upper and lower surfaces, the lower surface of the thin film structure having a plurality of connection points formed thereon. A high density connector may be positioned within said aperture and attached to the connection points on the exposed lower surface of the thin film structure. Preferably, the rigid support base is made of ceramic or silicon and the thin film structure comprises interleaved layers of a patterned metal, such as copper, and an organic polymer, such as a polyimide. Vias may be formed in the support base to provide direct, low impedance power and ground paths to the integrated circuit chips or other microelectronic components. The high density connectors may be used to route signals between adjacent substrates in a three-dimensional multichip module.

A method of making the substrate of the present invention comprises providing a generally planar rigid support base, forming a thin film structure on a surface of said support base, and removing a portion of said support base thereby exposing a portion of the lower surface of the thin film structure. The foregoing method may be accomplished by providing a generally planar rigid support base, forming an aperture in said support base, filling said aperture in said support base, planarizing a surface of the support base, forming a thin film structure on the planarized surface of the support base, and removing the fill material from the aperture thereby exposing the lower surface of the thin film structure. The foregoing method may also be accomplished by providing a generally planar rigid support base, forming an aperture in said support base, depositing an adhesive material on a surface of said support base, placing a plate over the adhesive material, such that the aperture is covered, forming a thin film structure over the plate, including a plurality of bonding pads that are positioned on the lower surface thereof, and removing the portion of the plate which lies within said aperture thereby exposing the lower surface of the thin film structure and the bonding pads positioned thereon.

DETAILED DESCRIPTION

Figure 1:
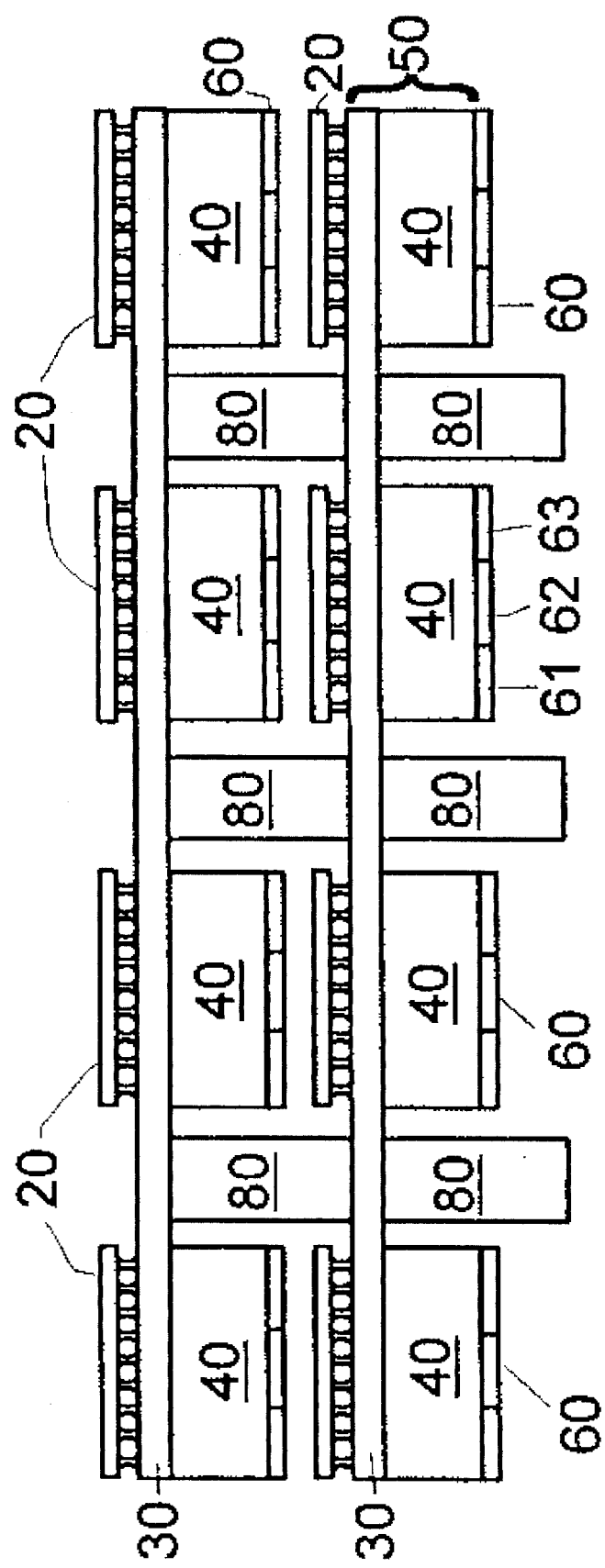
FIG. 1 is cross-sectional view of a multichip module of the present invention comprising two multichip module substrate.

The present invention comprises a highly modular, three-dimensional multichip module for use in packaging a large number of integrated circuit "chips" in a dense array. A trend in modern digital IC technology is towards ever greater signal speeds, i.e., very high frequency operation. Many such devices now operate in the range of microwave frequencies, so that the physical distance between components can have a significant effect on the performance of the components. Accordingly, new IC chip packaging technologies have been developed to house multiple chips in very close proximity. The greatest chip densities are achieved in three-dimensional chip arrays.

In three-dimensional multichip modules, a plurality of individual IC chips are mounted in planar arrays, typically on planar substrates, and the planar substrates are then stacked. The planar chip substrates of the present invention will be referred to herein as multichip module substrates. For convenience, the x and y directions will be used to define the planar axes of the multichip module substrates and the z direction will be used to define an axis which is orthogonal to the planar substrates, i.e., the z axis corresponds to the direction in which the substrates are stacked.

In determining the optimal arrangement of chips in a three-dimensional array, where chip-to-chip signal speed is a limiting factor, one must take into account the number of chips per functional unit in the module ($N_F$), the chip-to-chip pitch in the x and y directions ($P_x$, $P_y$), the layer-to-layer pitch in the z direction ($P_z$), and the number of functional units which need to communicate with other functional units ($N_s$). A functional unit is defined as being a collection of one or more chips which act as a unit, for example as a CPU, a controller, or the like. Assuming that all signal routing occurs in directions along the axes of the system, it can be shown that the optimum number of chips per board ($N_b$) can be calculated as follows:

$$N_b = [2 N_s N_F P_z V_{xy}/(P_x + P_y) V_z]^{2/3}$$

where $V_{xy}$ and $V_z$ are the velocity of electromagnetic wave transmission in the xy and z directions, respectively, and are dependent on the material used for electrical connection in the respective directions. This calculation proceeds with the assumption that, for a given number of chips per module, the distance (i.e., the length of the signal route) between any two chips is to be minimized. Generally speaking, it should be apparent that to minimize interchip distances, each of the layers should be generally square, and the overall module should be generally cubic if $V_{xy} = V_z$. If $P_x = P_y$, then, optimally, the number of chips disposed along the x and y axes of a substrate should be equal. Even when the number of chips to be mounted is small, the above equation will produce surprising results. For example, when using just four chips, it can be shown that, under typical circumstances, the optimal number of chips per board will be just one, i.e., it is best to simply stack the chips. However, the utility of the above equation is most significant where the number of chips is large, for example, in excess of ten.

Another assumption of the above equation is that signal routing in the z-axis is direct, i.e., that signals travelling from a chip on one substrate can follow a direct path to a chip on another substrate. However, in known multichip modules, z-axis routing has been at the edges of the substrates, thereby increasing the signal path length. According to the present invention, there are "communications bars" also called "z-axis connectors" positioned on the surfaces of the chip substrates away from the edges of the substrates, i.e., at intermediate locations on the major surfaces of the multichip module substrates. When z-axis connectors are positioned on the substrates, signals must be routed in the z-direction through the substrates. However, it is difficult to form a high density of signal paths through a relatively thick rigid support base and, thus, the number of connections are limited if the z-axis connectors are mounted on the support base. Accordingly, pursuant to the present invention, apertures are formed in the support base thereby exposing bottom regions of a thin film structure formed on the support base. Z-axis connectors may then be connected directly to both sides of the thin film structure, thereby achieving a very high density of connections.

Turning now to FIG. 1, an exemplary multichip module 10 of the present invention is shown in cross-section. For illustrative purposes only two layers, each carrying four rows of substantially identical integrated circuit chips are shown. Those skilled in the art will appreciate that additional layers and IC chips may be added in accordance with the present invention, and that the IC chips need not be identical.

In FIG. 1, a plurality of IC chips 20 are flip-chip mounted directly onto the surface of a thin film structure 30, that has been formed on the surface of a support base 40. The combination of the thin film structure 30 and the support base 40 will be referred to herein as multichip module substrate 50. The flip-chip connections can be solder bumps, as is well known in the art, or wire interconnects as described in U.S. patent application Ser. No. 07/977,571, filed Nov. 17, 1992, now U.S. Pat. No. 5,334,804, issued Aug. 2, 1994, the disclosure of which is hereby incorporated by reference. While flip chip mounting is preferred due to the very high density of interconnects that can be made, the present invention is not limited to flip chip mounting. Likewise, although IC chips 20 are shown mounted directly on thin film structure 30, interposer substrates may be used, such that the IC chips are mounted on interposer substrates which, in turn, are mounted on multichip module substrates 50. Such interposer substrates may be used to provide bypass capacitance in close proximity to the IC chips.

In the preferred embodiment of the present invention, thin film structure 30 comprises a plurality of interleaved polyimide and patterned copper layers. Methods of making a thin film structure of the type which is preferred are well known to those skilled in the art and need not be described in detail. Patterned copper layers are used to provide signal routing in the multichip module. Signal lines lie generally along the x and y axes of the system, and may be fabricated to have a controlled impedance. In addition, patterned copper layers may be used to form bypass capacitance in thin film structure 30, and to provide power redistribution within the thin film structure.

Preferably, however, the primary power distribution of the present invention is provided by power bars 60 which are mounted on the underside of rigid support base 40 (i.e., the surface of the support base opposite from the surface thin film structure 30 is formed upon). As shown, preferably, power bars 60 are mounted directly below rows of IC chips 20 such that the distance between a power bar 60 and an overlying IC chip 20 is minimized. Power is routed from power bars 60, which are relatively thick and, thus, low in impedance, to an IC chip 20 using vias 70 formed through the support base 40 (see FIGS. 2 and 3), and then through vias formed thin film structure 30 (not shown). The vias in support base 40 are relatively large in diameter to provide a short, low impedance path for the power supply. As noted, thin film structure 30 may, optionally, comprise power redistribution layers, in the event that a pad on an IC chip does not directly overlie a power bar of appropriate voltage. Power bars suitable for use in the present invention, and methods of making such power bars are described in the grandparent application, Ser. No. 07/925,962 filed Aug. 5, 1992, now abandoned the disclosure of which is incorporated by reference.

In the preferred embodiment, power bars 60 consist of multiple strips, each carrying a different voltage potential. In the example illustrated in FIG. 1 power bar 60 comprises three power strips 61, 62 and 63. Two of the power strips are used for different supply voltages and the third is held at a ground reference potential. Of course, the number of power strips my be varied according to the needs of the IC chips or other components mounted on the substrate.

The support base of the present invention may of any suitable material such as silicon, ceramic, glass or other rigid dielectric. Conductive, e.g., metal, plates may also be used. If a metal plate is used it should have the ability to maintain tight geometrical specifications at the high processing temperatures associated with fabrication of the thin film structure and with operation of the thin film module. For example, polyimide layers are generally cured at temperatures of at least 400° C. In addition, the metal must be able to tolerate the chemicals used in the fabrication of the thin film structure. Finally, structure must be added to electrically isolate the metal plate from the power bars and the vias used to provide electrical potentials to the thin film structure and IC chips. Ceramics and silicon are preferred substrate materials due to the highly developed technologies associated with their use in electronic applications. As described in detail below, the processing steps for constructing the multichip module substrates of the present invention may vary depending on the material chosen for the support base.

A plurality of z-axis connectors 80 are used to connect adjacent multichip module substrates 50. In the preferred embodiment, z-axis connectors contain a plurality of signal lines used to couple the IC chips on different substrates. As shown in FIG. 1, an exemplary z-axis connector 80 is connected at one end to the upper surface of a multichip module substrate 50 (i.e., the upper surface of thin film structure 30) and at its opposite end to an exposed lower surface of thin film structure 30. Although connectors are not shown in FIG. 1, connection between z-axis connector 80 and the surfaces of thin film structure 30, may be made by any suitable means such as solder bumps, wire interconnects, etc.

Figure 2:
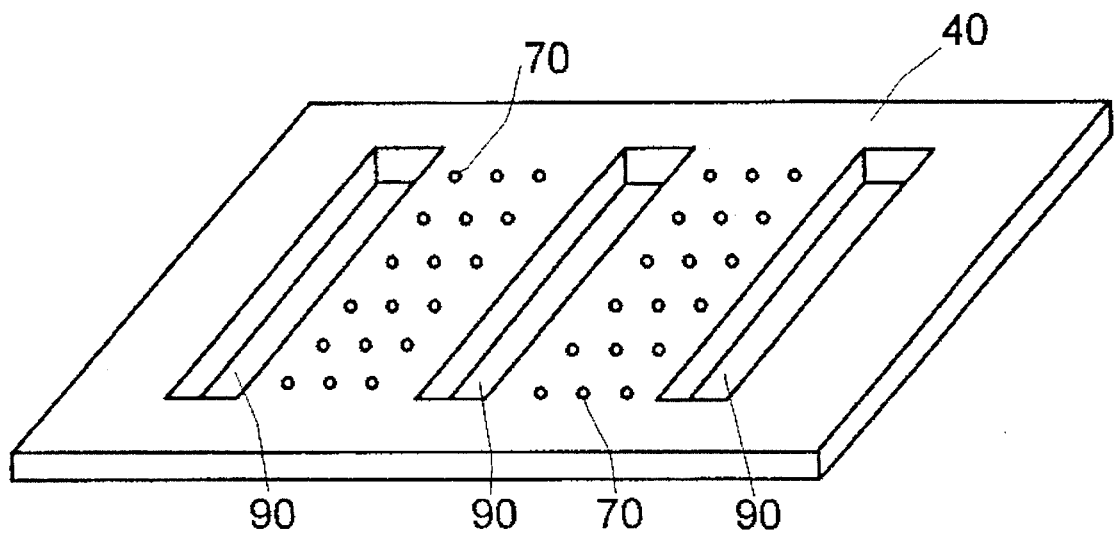
FIG. 2 is a perspective view of a rigid support base used in the present invention at an intermediate stage of fabrication.

The lower surface of thin film structure 30 is exposed by forming apertures in support base 40 (see FIG. 2). Thus, thin film structure 30 spans apertures 90. Upper and lower bonding pads 310, 320 (FIG. 3) are formed on thin film structure 30 for connecting to z-axis connector 80. By forming apertures 90 in support base 40, and spanning the apertures with thin film structure 30, it becomes possible to attach the z-axis connectors directly to both sides of the thin film structure. This greatly increases the density of connection points that can be made, thereby greatly increasing the number of signal path channels between layers. For example, when using the wire interconnects of the type described in the above-mentioned U.S. patent application Ser. No. 07/977,571, the minimum diameter of the wire is about 12 µm and, therefore, the interconnect pitch may be as little as 25 µm. In contrast, it is believed that the densest interconnect pitch that could be achieved if the connectors were formed on a ceramic support base would be approximately 200 µm.

It will be seen from FIG. 1 that the stacked substrates of the present invention form enclosed cooling channels between adjacent layers. Fluid may be made to flow through these cooling channels to remove heat generated by the multichip module. Heat generation and removal is a major concern in high performance three-dimensional multichip module applications. If cooling channels are needed, z-axis connectors (or inactive dummy spacers) may be added to the upper surface of the uppermost multichip module substrate and a passive plate attached to the top to form channels for the IC chips mounted on the upper most substrate. Likewise, an active or passive substrate may be attached to the lowermost z-axis connectors to enclose cooling channels. Finally, edge connectors, not shown, may be added to link the multichip module with external devices. Alternatively, lowermost z-axis connectors 80 may be used for this purpose.

Figure 3:
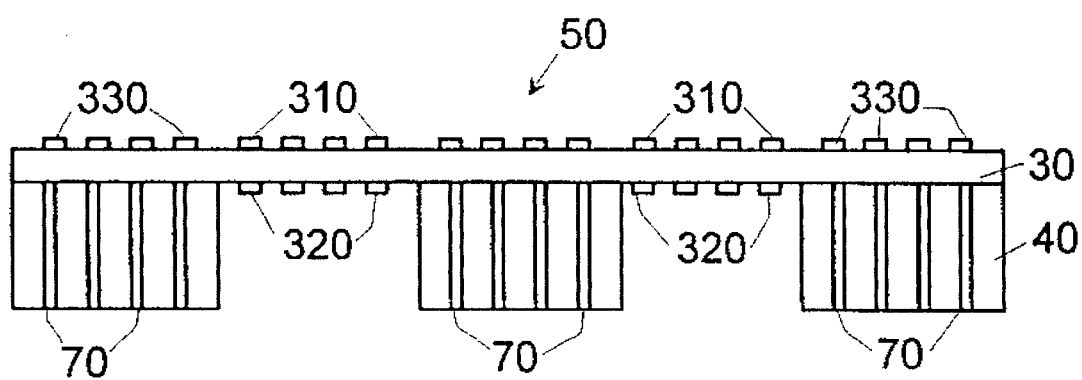
FIG. 3 is a cross-sectional view of a multichip module substrate according to the present invention.

The multichip module substrate of the present invention may be made by a variety of techniques, the selection of which will depend, in part, on the material of the support base. In one method of making the present invention, a support base is first provided, and vias 70 are formed in the support base. The thin film structure is then fabricated on top of the support base using well-known methods. In the preferred embodiment, thin film structure 30 comprises alternating layers of polyimide, benzocyclobutene (BCB), or other suitable organic polymer, and copper, aluminum or other suitable metal. The copper layers may have thin films of other materials, such as chromium, to promote adhesion to the polyimide layers. The thin film structure is made to include lower bonding pads 320 for attaching a z-axis connector. (For illustrative purposes, bonding pads 320 are shown in FIG. 3 projecting downward from the surface of thin film structure 30. Those skilled in the art will appreciate, however, that in accordance with preferred methods of making the present invention bonding pads 320 will be flush with the lower surface of thin film structure 320.) Likewise, bonding pads 310 are formed on the upper surface of thin film structure 30 for attaching to a z-axis connector. Likewise, bonding pads 330 are formed for attaching IC chips to multichip module substrate 50.

As noted above, thin film structure 30 includes means, such as vias, for coupling power from vias 70 to bonding pads 330, and may also include bypass capacitance, and power redistribution layers, as well as signal routing. For illustrative purposes, only a small number of bonding pads 310, 320 and 330, and vias 70 are shown. Those skilled in the art will appreciate that in an actual embodiment there will be many more of each of these elements.

After thin film structure 30, including bonding pads 310, 320 and 330, are fabricated, portions of the support base are removed thereby forming a plurality of apertures in the support base and exposing bonding pads 320. It will be noted that thin film structure 30 spans the apertures in the support base. Techniques for the removal of the portions of the support base will depend in part on the type of material that is selected. An etching, sandblasting or milling process is suitable for many types of materials, such as silicon and ceramic. A photoimagable ceramic may be used to facilitate the etching process.

It is noted, however, that some ceramics are difficult to remove without risking damage to the thin film structure. Alternative methods of forming the multichip module substrate of the present invention involve removing portions of the support base to form apertures for the z-axis connectors prior to fabricating the thin film structure. These methods require that the apertures then be covered or filled to allow the subsequent formation of the thin film structure. The merit of these approaches is that the material used to cover the apertures can be removed more easily after fabrication of the thin film structure than certain types of ceramics which may be used for the support base.

These alternative methods start with a support base 40 that has apertures 90 and vias holes 70 formed therein, as shown in FIG. 2. In one embodiment, an adhesive material, such as a high temperature polyimide or a low melting or softening point glass is deposited on top of the support base. A relatively thin plate is then adhered to the surface of the adhesive material. The thicknesses of the adhesive material and the plate can be controlled according to the requirements for mechanical support and via fabrication. (The plate, which may be made of ceramic, silicon or printed wiring board (PWB) material is typically between 400 µm and 1200 µm thick. The adhesive layer is typically between 25 µm and 100 µm thick.) The via holes are then extended through the adhesive material and plate, and vias are formed in the via holes. Alternatively, support base 40 may initially be formed without via holes, and the via holes formed through all three layers (i.e., the support base, the adhesive material and the plate) in one step. The via holes may be formed in the layers by traditional means such as laser ablation or reactive ion etching. Thereafter, the thin film structure is fabricated on top of the plate with bonding pads for connecting to vias 70 and to the z-axis connectors. Finally, the portions of the plate that overlie apertures 90 are etched away to expose the bonding pads for the z-axis connectors, which are then attached.

In another alternative method of making the present invention, the support base 40 with apertures 90 formed therein is covered with a dry thin film of material such as KAPTON, a polyimide widely used in the electronics industry. ("KAPTON" is a registered trademark of E.I. DuPont de Nemours & Co. of Wilmington, Del.) The film may be attached to the support base using heat lamination or an adhesive as above. The apertures in the support base are then filled with an easily etchable material, such as a polyimide, glass or metal. The thin film structure is then fabricated over the KAPTON layer, and includes bonding pads on both surfaces as described above. Finally, the fill material is etched away and the portion of the KAPTON or other film spanning the apertures is etched away to expose the underside of the thin film structure including the bonding pads for attaching z-axis connectors.

Yet another alternative method of making the present invention comprises, once again, starting with a support base having apertures for the z-axis connectors formed therein. A plate of suitable material, such as graphite, is placed over the support base and the apertures are again filled with an easily removable material such as glass or metal. Preferably, the fill material is flowed to ensure that the aperture is completely filled. After cooling the filled support base, the graphite plate is removed, and the upper surface of the support base is polished to provide a smooth surface and to remove any of the fill material that may have flowed into gaps between the plate and the support base. The thin film structure, including z-axis connector bonding pads, is then formed over the smoothed surface of the support base. Finally, the fill material is removed, as by etching or melting, exposing the bonding pads for the z-axis connector. Of course, if a metal fill material is used, the metal must be different than the metal used for the bonding pads to allow selective etching. In a variation of this alternative, a metal is deposited on the walls of the aperture and the fill material, such as glass, is placed in the remainder of the aperture. This allows easy removal of the fill material as a plug by etching the metal.

The multichip module substrate of the present invention allows for a high density of interconnection between stacked substrates in three-dimensional multichip modules. The thick support base not only supports the thin film structure, which is too thin to retain rigidity, but also enables a low resistance electrical path for the power and ground lines by using relatively large diameter vias positioned directly below the IC chips. The thin film structure allows a high density of signal lines and interconnect lines with controlled impedances that are not possible with thick film (e.g., ceramic) technologies. The ability to connect to top and bottom surfaces of the thin film structure significantly increases the vertical (z-axis) interconnect density since smaller bond pads may be defined in thin film structures.

While the present invention has been described with reference to the preferred embodiments thereof, it will be apparent to those skilled in the art that there are many equivalents and alternatives to the precise structures described herein. For example, although the present invention has been described in connection with three-dimensional multichip modules, those skilled in the art will appreciate that the invention may also have applicability to two-dimensional multichip modules, or for other applications wherein microelectronic components are mounted on two sides of a high-density thin film structure. Accordingly, it is intended that the above specification not be limiting and that the invention be understood solely in reference to the following claims.

What is claimed is:

1. A substrate for mounting microelectronic components, comprising:
    a generally planar rigid support base having upper and lower major surfaces and an aperture between said upper and lower surfaces,
    a thin film structure disposed on one of said major surfaces of said rigid support base such that said thin film structure spans said aperture, the portion of said thin film structure which spans said aperture having exposed upper and lower surfaces,
    a plurality of connection points located on the exposed lower surface of said thin film structure, and
    a plurality of vias extending between the upper and lower surfaces of said support base.

2. The substrate of claim 1 further comprising a high density connector positioned within said aperture and connected to said connection points.

3. The substrate of claim 1 wherein said rigid support base is silicon.

4. The substrate of claim 1 wherein said rigid support base is ceramic.

5. The substrate of claim 1 wherein said thin film structure comprises a plurality of patterned metal layers interleaved with a plurality of organic polymer layers.

6. The substrate of claim 5 wherein said metal layers comprise copper and said organic polymer layers comprise a polyimide.

7. The substrate of claim 2 further comprising a plurality of connection points on the upper surface of said thin film structure for connecting to a plurality of integrated circuit chips.

8. The substrate of claim 1 wherein there is a plurality of substantially identical apertures in said support base, and a portion of said thin film structure spans each said aperture.

9. A multichip module, comprising:
    an integrated circuit chip substrate comprising a rigid support base having a plurality of vias and an aperture therein, and a thin film structure disposed over a surface of said support base, said thin film structure having upper and lower surfaces, the thin film structure spanning said aperture such that the lower surface of the thin film structure within the aperture is exposed,
    a connector mounted on said exposed lower surface of said thin film structure within said aperture, and
    a plurality of integrated circuit chips mounted on the upper surface of said thin film structure.

10. The multichip module of claim 9 wherein said rigid support base comprises a ceramic or silicon.

11. The multichip module of claim 9 comprising a plurality of said integrated circuit chip substrates stacked to form a three-dimensional multichip module.

12. The multichip module of claim 11 wherein said connector joins adjacent substrates in said three-dimensional multichip module.

13. The multichip module of claim 11 wherein each of said integrated circuit chip substrates has a plurality of apertures formed therein.

14. The multichip module of claim 11 wherein the support base of each substrate has a plurality of vias formed therein, said vias extending between the surfaces of the support base.

* * * * *

UNITED STATES PATENT AND TRADEMARK OFFICE
CERTIFICATE OF CORRECTION

PATENT NO. : 5,544,017
DATED : August 6, 1996
INVENTOR(S) : Solomon I. Beilin, *et al.*

It is certified that error appears in the above-indentified patent and that said Letters Patent is hereby corrected as shown below:

Column 1, line 6, after "No. 5,426,563," insert --issued June 20, 1995.--

Column 6, line 59, after "may" insert --be--.

Signed and Sealed this

Seventh Day of January, 1997

Attest:

BRUCE LEHMAN

*Attesting Officer*  *Commissioner of Patents and Trademarks*